United States Patent
Tada et al.

[11] 4,082,942
[45] Apr. 4, 1978

[54] PROCESS CONTROL SYSTEM WITH SIGNAL CONVERSION TO STANDARD INTERMEDIATE SIGNALS CARRYING DATA AS A FUNCTION OF TIME DURATION

[75] Inventors: Osamu Tada; Mutsuaki Nakagawa; Hiroshi Mori; Yutaka Wakasa; Koju Kataoka; Tadanari Inoue; Hisayuki Uchiike, all of Musashino, Japan

[73] Assignee: Yokogawa Electric Works, Ltd., Tokyo, Japan

[21] Appl. No.: 812,060

[22] Filed: Jul. 1, 1977

Related U.S. Application Data

[63] Continuation of Ser. No. 618,268, Sep. 30, 1975, abandoned.

[51] Int. Cl.² ............... H03K 13/20; G05D 27/02
[52] U.S. Cl. .................... 364/111; 340/184; 340/347 M; 340/347 AD; 340/347 DA
[58] Field of Search ... 340/347 M, 347 AD, 347 DA, 340/147 MP, 184; 235/92 MP, 151.1, 151.11, 151.12

[56] References Cited

U.S. PATENT DOCUMENTS

| | | | |
|---|---|---|---|
| 3,513,468 | 5/1970 | Fluegel | 340/347 DA |
| 3,585,371 | 6/1971 | Dowling | 235/92 DE X |
| 3,940,600 | 2/1976 | Alexander et al. | 235/151.12 |

OTHER PUBLICATIONS

Hoeschele, Analog-to-Digital/Digital-to-Analog Conversion Techniques, John Wiley & Sons, Inc., 8/68, pp. 372-381.
Schmid, Electronic Analog/Digital Conversions, Van Nostrand Reinhold Co., 1970, pp. 204, 205.
The Engineering Staff of Analog Devices, Inc., Analog-Digital Conversion Handbook, pp. I-106 to 109; III--40 to 43; III-50, 51.

*Primary Examiner*—Thomas J. Sloyan
*Attorney, Agent, or Firm*—Parmelee, Johnson, Bollinger & Bramblett

[57] ABSTRACT

A process control system of the type arranged to accept varied forms of analog sensing signals from field sensing devices, to digitally process data represented thereby, and to supply varied forms of analog control signals to field control devices. The system is characterized by signal converter means which convert data between the varied analog forms generated by the field devices and a standard form of intermediate signal, e.g., a pulse-width signal, which carries data as a function of duration. The intermediate signals facilitate signal transmission, editing, and isolation, and permit the process control system to have a simple, noise-free, easily adaptable structure. Digital interface means then convert data between the intermediate signals and digital signals in a form suitable for use by digital data processing means.

1 Claim, 14 Drawing Figures

PROCESS CONTROL SYSTEM WITH SIGNAL CONVERSION TO STANDARD INTERMEDIATE SIGNALS CARRYING DATA AS A FUNCTION OF TIME DURATION

This is a continuation, of application Ser. No. 618,268 filed Sept. 30, 1975, abandoned.

BACKGROUND OF THE INVENTION

1. Field of the Invention

The present invention relates to process control systems arranged to accept sensing signals from the field, to process data represented by said sensing signals, and to control field process devices according to the processed data.

2. Description of the Prior Art

Known process control systems generally are connected to a variety of field devices issuing or requiring many different forms of analog signals, such as currents, voltages, resistances, etc. The data processing portion of a process control system, however, requires standardized signals. This necessitates a mechanism for signal conversion between the varied field signals and the standardized control signals.

In known prior art process control systems, signal conversion mechanisms are designed to suit the particular control system, either digital or analog, that is used, with no interchangeability. As a result, no generalized process control system has been available.

In one known type of process control system using electronic digital computer processing, the interface between digital processing signals and analog field signals samples multipoint analog signals in sequence with a multiplexer in response to commands from the computer, and then converts the signals to digital form and supplies them to the computer. Digital output signals from the computer are first converted to analog form and then supplied by a demultiplexer to multipoint controlled elements. In such arrangements, the multiplexer and demultiplexer must match the computer efficiency and require digital control circuits which complicate design, production, and servicing.

In another known arrangement, varied field analog signals are standardized, in analog form, before analog-to-digital conversion and after digital-to-analog conversion. In such devices, however, the standardized intermediate signal is a voltage or current signal varying in amplitude in a predetermined range. Such signals are vulnerable to noise and require intricate noise removing arrangements including a filter to remove normal noise, and isolation means to remove common mode noise. Practical circuits require a significant number of isolation means, necessitating considerable design complication.

In some known process control systems, a digital computer processor has an analog monitoring means and backup means. The field devices are connected to the monitoring and backup means through the multiplexer and demultiplexer, and must be isolated from the monitoring and backup means as well. The extra isolation means and interconnections add much complexity to the system.

Finally, known process control systems have signal transmission arrangements that are not entirely satisfactory. Signals commonly are transmitted over individual transmission lines, which are grouped into multicore cables handling proximate field sensing and control devices. The same cable, therefore, carries signals with a variety of forms, such as voltage, current, resistance, etc. As the size of a process increases, the number of cables and transmission lines also increases. The arrangement of input and output terminals at the control system, however, is dictated by the control system. To lead the signal transmission lines, wrapped in cables, to the individual terminals, transmission lines must be re-edited and regrouped with a significant expenditure of labor. Adding to the difficulty of re-editing is the fact that practical transmission lines are designed to withstand harsh environments and are thick in diameter.

Because of the foregoing problems, known process control systems have not been entirely satisfactory in interfacing varied field analog sensing and control signals with digital data processors.

SUMMARY OF THE INVENTION

It is a principal object of this invention to provide an improved process control system capable of accepting varied analog sensing signals from field sensing devices, to digitally process data represented thereby, and to supply varied analog control signals to field control devices. Specific objects of the present invention are to provide a process control system which is compatible with both analog and digital control devices, which has an intermediate signal little affected by noise, which simplifies isolation between input and output signals, which can handle a large number of signals without using multiplexers and demultiplexers, which permits analog monitoring and backup processing devices to be easily incorporated, and which simplifies the editing of signals between the field devices and the data processing devices. Still another object of the invention is to provide a process control system of the type described which is more suitable for practical, commercial use.

In a preferred embodiment of the invention to be described hereinbelow in detail, the process control device comprises signal converter means for converting data back and forth between the varied analog forms used by the field devices and a standard form of intermediate signal carrying data as a function of duration, such as a pulse-width signal. Digital interface means then convert data back and forth between the intermediate signals and digital signals suitable for use by the digital data processing means. The standardized intermediate signal, carrying data as a function of duration, i.e., on its time axis, permits easy conversion back and forth between analog and digital signal forms, and is inherently compatible with both analog and digital control devices. Such an intermediate signal, moreover, permits simpler isolating and editing devices to be used, and thereby simplifies the construction of the process control system. In further aspects of the invention, the process control system includes, intermediate the signal converter means and the digital interface means, signal isolation means and signal editing means, and the digital interface means comprises means for storing data in digital form to be available upon demand for processing by the digital data processing means, and for conversion into the standard intermediate form of signal.

Other objects, aspects and advantages of the invention will be pointed out in, or apparent from, the detailed description hereinbelow, considered together with the following drawings.

DESCRIPTION OF THE PREFERRED EMBODIMENT

Figure 1A:
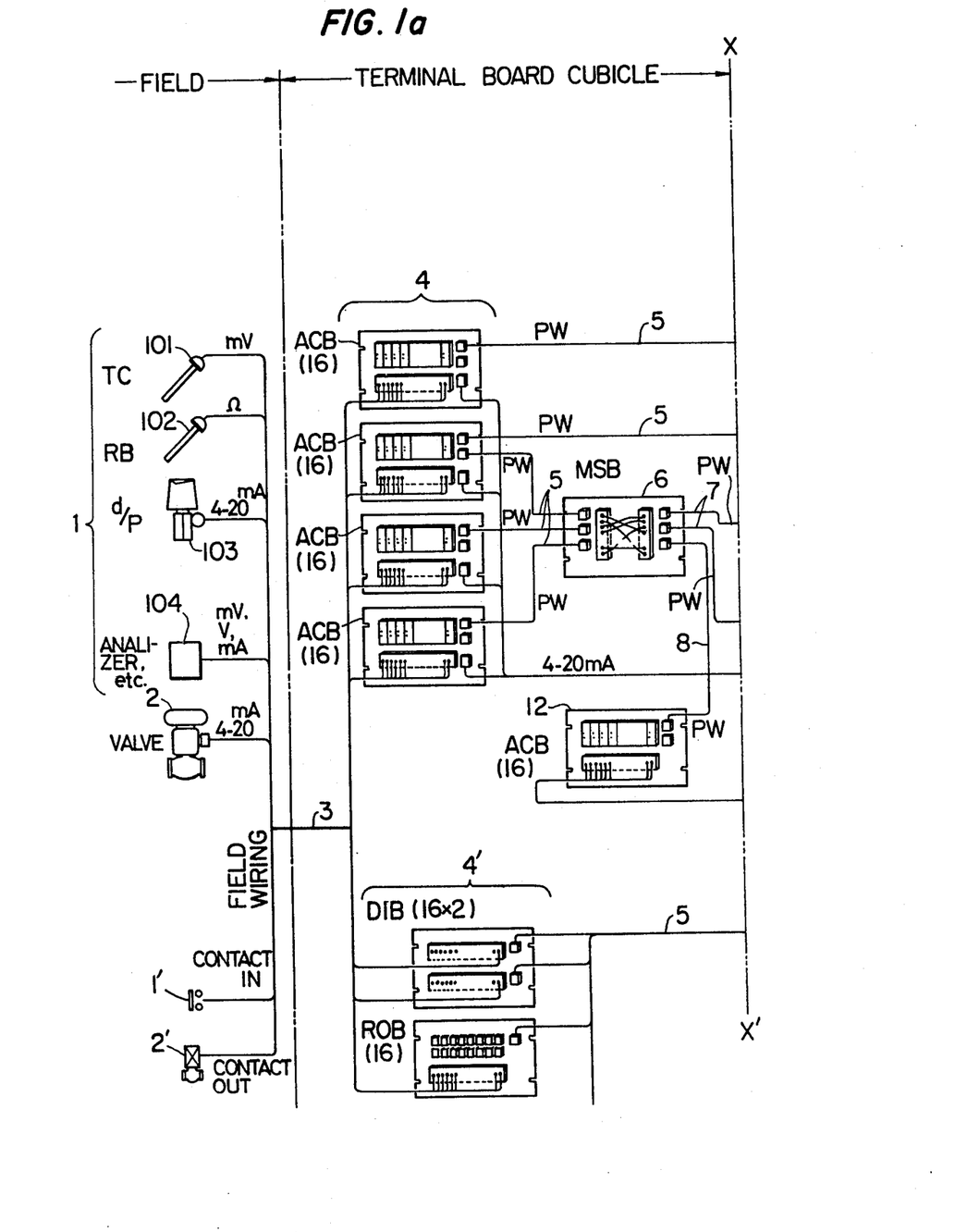
FIGS. 1a and 1b, when joined together at line x—x', schematically illustrate a process control system according to the present invention.
Figure 1B:
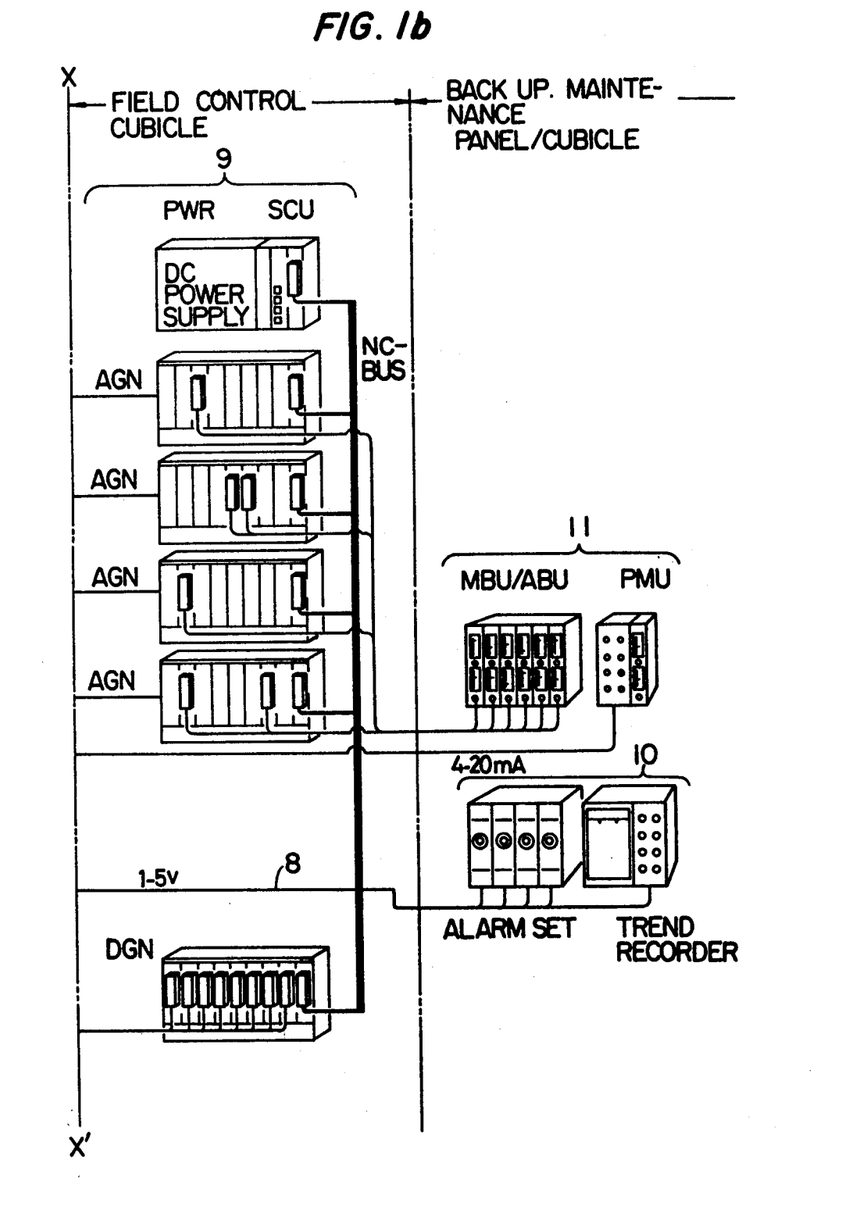

FIGS. 1a and 1b illustrate schematically a process control system constructed according to the present invention and arranged to exchange signals with field devices, indicated generally as field sensing devices or detectors 1 and 1' and field control devices or responders 2 and 2'. Input and output signals are exchanged with the field devices on an input and output signal transmission line 3.

The process control system comprises a signal converter 4 and a contact signal input and output device 4' connected to transmission line 3, intermediate signal-carrying cables 5 from signal converter 4, an editor 6 joining with cables 5, cables 7 and 8 from editor 6, a digital control device indicated generally at 9 and joining with cables 5 and 7, an analog processing device indicated generally at 10 and joining with cable 8 through a second signal converter 12, and an analog backup device indicated generally at 11.

The field sensing devices 1 supply varied analog input signals and comprise, for example, process detection devices such as a thermocouple 101, a resistance thermometer bulb 102, a differential pressure transmitter 103, and an analyzer 104, which generate analog signals measured in millivolts, ohms, milliamperes and volts respectively. The field sensing device 1' detects the status of a process and generates an on-off input signal. The field control device or responder 2, e.g., a flow control valve, manipulates a given process point according to an analog output signal from the control system. Similarly, a contact output signal operates field control device 2', e.g., a solenoid operated valve. The output signal supplied to the flow control valve 2 is in the form of a DC current in milliampere units, and that supplied to the solenoid operated valve 2' is an on-off signal.

The signal converter 4 converts the varied forms of analog input signals received from field sensing devices 1 and 1' into a standard form of intermediate signals representing physical quantities in a standardized range. The signal converter 4 also converts control signals, given in terms of the standard intermediate signal, into output analog signals in forms suited for the field control devices 2. In accordance with the present invention, the intermediate signal is one representing data as a function of time duration, i.e., one carrying data on its time axis, such as a pulse-width signal, a pulse-number signal, or a frequency signal. In the illustrated embodiment, a pulse-width signal is selected for the intermediate signal for explanatory simplicity.

Figure 2:
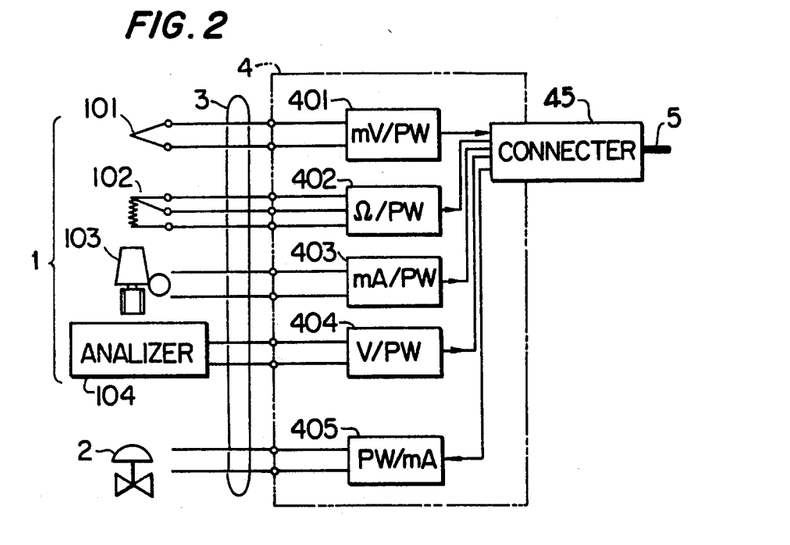
FIG. 2 is a schematic diagram showing the analog-to-intermediate signal converter 4 of FIG. 1.

As shown in FIG. 2, the signal converter 4 comprises individual converter units which vary according to the form or field input and output signals they are to handle. One unit block ACB of the signal converter 4 may comprise, for example, a low voltage to pulse-width converter unit 401 for thermocouple 101, a resistance to pulse-width converter unit 402 for thermometer bulb 102, a current to pulse-width converter unit 403 for pressure transmitter 103, a voltage to pulse-width converter unit 404 for analyzer 104, and a pulse-width to current converter unit 405 for flow control valve 2. Circuits capable of converting a voltage into a pulse-width signal are well known as a major constituent element of the integrating A/D converter, and it is also well known that current or resistance signals can easily be converted into voltage signals in a standardized range. With these techniques, the converter units 401 to 404 are arranged to convert low-voltage, resistance, current and voltage signals into the individual pulse-width signals varying duration in a standardized range. The pulse-width to current converter unit 405 operates, for example, by turning a constant voltage source on and off with the pulse-width signal, and by smoothing or time-averaging the resultant on-off current. As described below in relation to FIGS. 3 and 4, an isolation means is provided in the intermediate signal stage of each of the converter units 401 to 405. Isolation is readily accomplished at this stage with a transformer or a photocoupler since the intermediate pulse-width signal carries data on its time axis. Thus the process or field side of the system can be easily isolated from the control side of the system.

Figure 3:
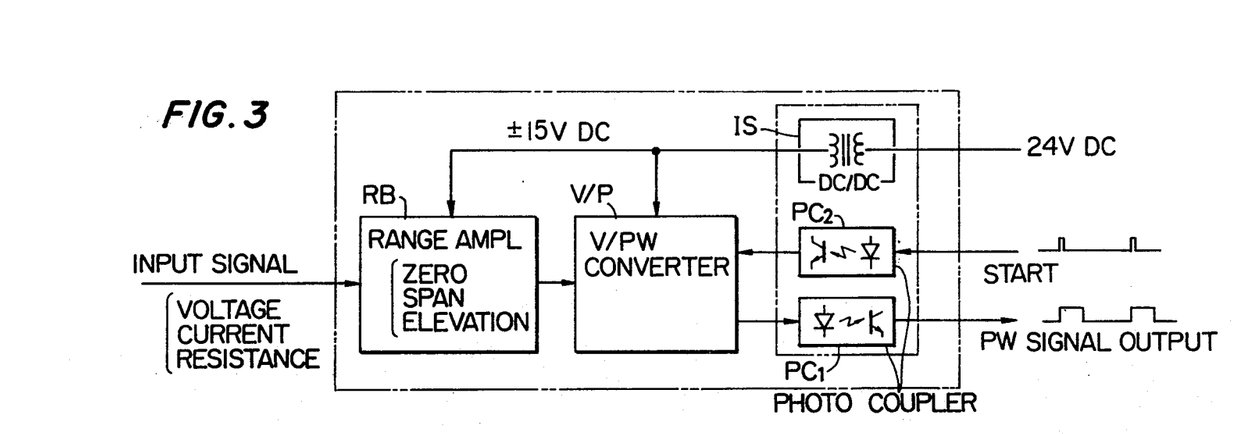
FIGS. 3 and 4 are schematic diagrams of individual converter units of the signal converter of FIG. 2.
Figure 4:
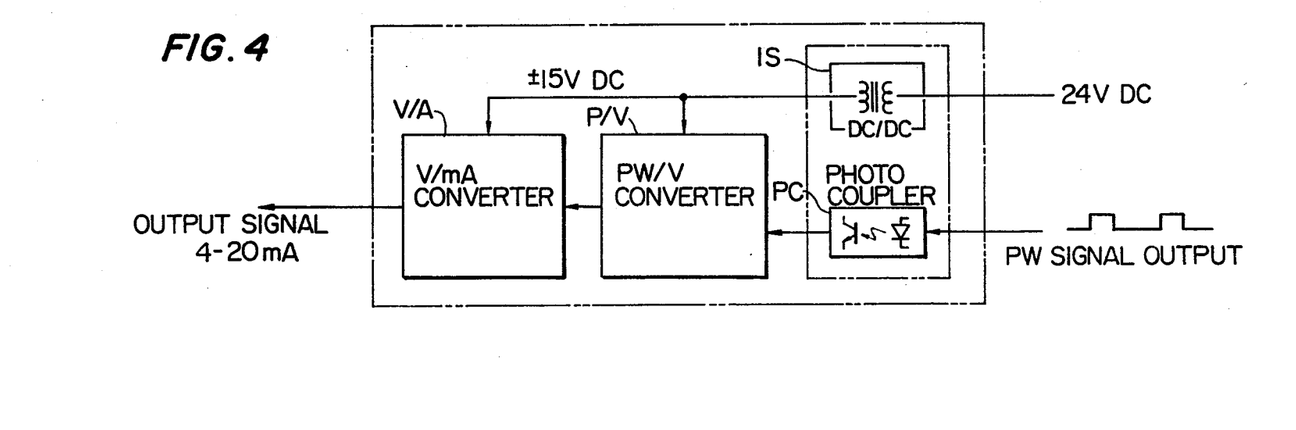

FIGS. 3 and 4 show in block form the fundamental construction of input signal converter units 401 to 404 (FIG. 3) and output signal converter unit 405 (FIG. 4). In the input signal converter unit shown in FIG. 3, an analog input signal is first converted into a voltage signal varying its amplitude in a standardized range by a range circuit RB and this voltage signal is then converted into a pulse-width signal by a pulse-width converter circuit V/P. The pulse width signal is available as an output through an isolating photocoupler $PC_1$ whenever a timing signal is received through and isolating photocoupler $PC_2$ by the pulse-width converter circuit V/P. The range circuit RB and the voltage to pulse-width converter circuit V/P are supplied with power through an isolator IS which comprises a DC/DC converter.

In the output signal converter unit shown in FIG. 4, a pulse-width signal from the control side of the system is supplied to a pulse-width to voltage converter circuit P/V through an isolating photocoupler PC and is first converted into an analog voltage signal, which is then converted into, e.g., a current signal in a desired range by a voltage to current converter circuit V/A. The pulse-width to voltage converter circuit P/V and the voltage to current converter circuit V/A are supplied with power through an isolator IS.

As can be seen from the foregoing description of the signal converter units of this invention, the analog signal system is distinctly isolated from the digital control (pulse) signal system both electrically and mechanically. This contributes much to simplifying design, production process, and services. Each converter unit can be built on a printed circuit board, and the individual converter units can be oriented to the appropriate portions of the input and output signal transmission line 3.

The intermediate pulse-width signal terminals of the converter units 401 to 405 are converged at a connector 45 (FIG. 2) and are connected to either the digital control device 9 or to the editor 6 by means of cable 5. Since the amplitude level of the intermediate pulse-width signals may be equivalent to that of a signal handled in digital logical devices, the connector 45 and the cable 5 may be of a kind and quality normally considered suitable in such logical devices.

As shown in FIGS. 1a and 1b, the editor 6 is connected to the digital control device 9 and the second signal converter device 12 through cables 7 and 8 respectively, and the signal converter 12 is connected to the analog processing device 10 through cable 8. In the illustrated embodiment, the analog processing device 10 is shown as a monitor comprising an alarm set and a trend recorder. The purpose of editor 6 is to edit paths of intermediate signals which are to be transmitted between the signal converter device 4 and either the digital control device 9 or the analog processing device 10. Although this edition work may be done by varying jumper connections, it can more efficiently be done in accordance with the present invention by the use of a digital logical circuit because a digital logical circuit can efficiently manage the pulse-width signals whose transmission paths are to be edited.

Figure 5:
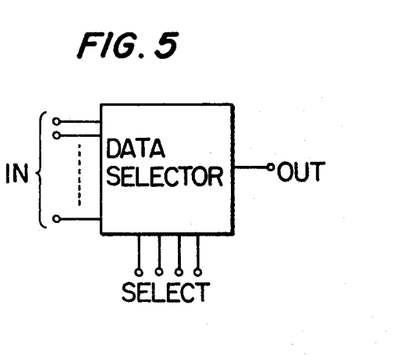
FIGS. 5 and 6 are schematic diagrams of devices suitable for the editor 6 of FIG. 1.
Figure 6:
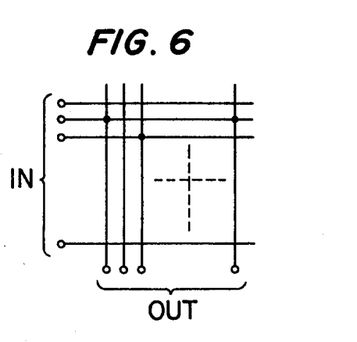

The editor 6 comprises either a data selector (FIG. 5) or a matrix (FIG. 6), arranged to select the necessary one out of a plurality of input signal paths and to connect it to a selected output path to the following stage, thereby facilitating signal path linking, branching and joining, with the result that the efficiency of signal transmission path edition is enhanced.

Figure 7A:
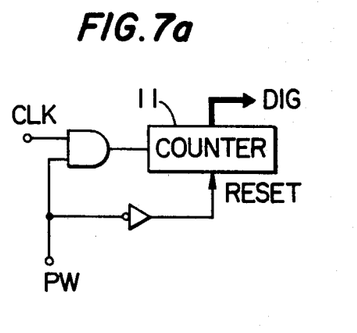
FIGS. 7a and 7b are schematic diagrams of circuits for digital interface devices, providing intermediate-to-digital signal conversion, and digital-to-intermediate signal conversion.
Figure 7B:
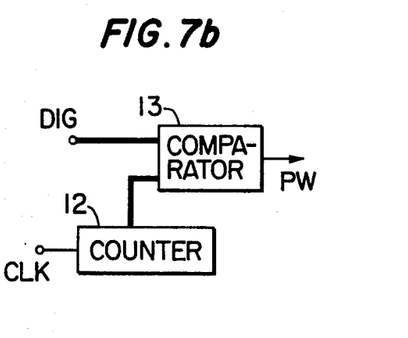

The intermediate pulse-width signal of the present invention is one readily compatible to conversion to and from a digital signal, as well as to and from an analog signal. An intermediate pulse-width signal is converted into a digital signal for digital processing in a converter circuit installed in the digital control circuit 9. In such a circuit, shown in FIG. 7a, the duration of a pulse-width signal PW is measured by a counter 11 receiving a train of clock pulses passed from a terminal CLK through an AND gate enabled by the pulse-width signal. The resultant counter output is a digital signal DIG. Conversion from a digital signal to an intermediate signal is also done with a circuit in digital control circuit 9 such as the one shown in FIG. 7b, in which the value of a digital signal DIG is compared with the uniformly increasing count value in a clock pulse counter 12 by a comparator 13. The resultant comparator output is an intermediate pulse-width signal PW.

Figure 8A:
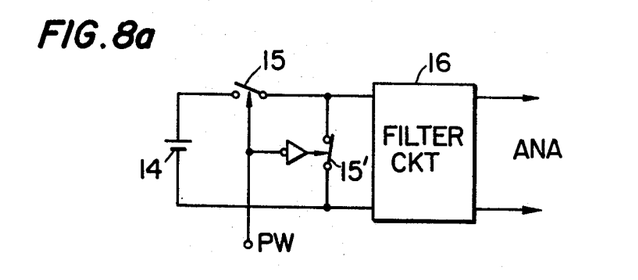
FIGS. 8a and 8b are schematic diagrams of circuits providing intermediate-to-analog signal conversion.
Figure 8B:
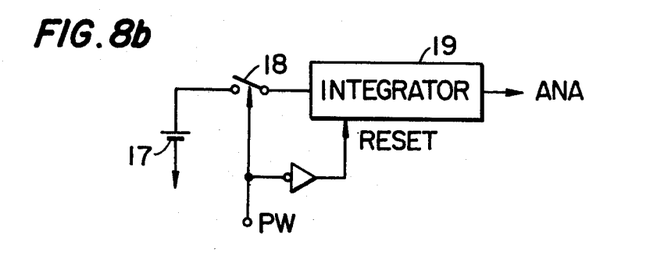

An intermediate pulse-width signal is converted into an analog signal, e.g., in the converter P/V of FIG. 4, by means of the circuits shown in FIGS. 8a and 8b. In the circuit shown in FIG. 8a, a voltage from a constant voltage source 14 is connected to a smoother or filter circuit 16 by serial switches 15 and 15' which are switched on and off by an intermediate pulse-width signal PW. Alternatively, in the circuit shown in FIG. 8b, a voltage from a constant voltage source 17 is connected to an integrator 19 by a switch 18 which is switched on and off by a pulse-width signal PW. The resultant output from either circuit is an analog signal ANA. The circuit shown in FIG. 8a is suited for applications where the pulse-width signal repeats periodically in a given cycle, and the one shown in FIG. 8b is suited for applications where the pulse-width signal does not steadily repeat. As mentioned before, an analog signal is converted into a pulse-width signal by the use of a pulse-width converter circuit of the type used in integrating A/D converters. Because conversion from an intermediate pulse-width signal into either a digital signal or an analog signal, or vice versa, can readily be made, the editor 6 can be connected to both the digital control device 9 and the analog processing device 10. Similar conversion from the intermediate pulse-width signal to an analog signal and vice versa is done by the second signal converter device 12, which is constructed the same as the signal converter device 4, previously described.

When the intermediate signal is a rate signal such as a pulse number or frequency signal, conversion from the rate signal to an analog signal and vice versa is accomplished through the use of known means such as V/F converters or F/V converters.

Figure 9:
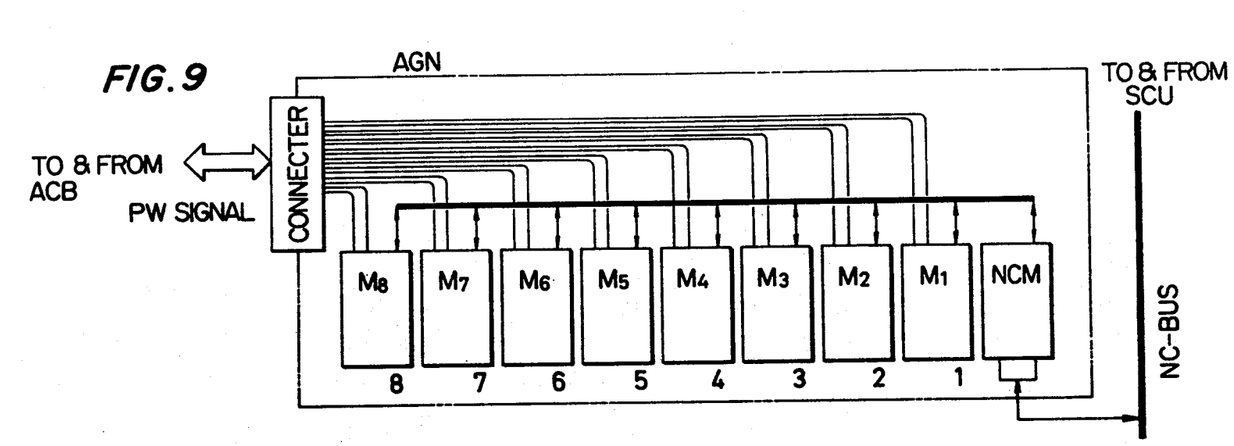
FIG. 9 is a schematic diagram of signal converting means in digital control device 9.

The digital control device 9, as shown in FIG. 1b, is arranged with a control unit SCU, a power source PWR, converters AGN to convert between intermediate and digital signals as described above with reference to FIGS. 7a and 7b, and a digital converter DGN connecting to converter 4'. The control unit SCU is connected to the analog converters AGN and digital converter DGN by an NC bus. The control unit SCU is substantially a digital computer of a type such as a microcomputer. As shown in FIG. 9, the converter AGN consists of a plurality of modules NCM, and $M_1$ to $M_8$ for managing pulse-width signals. Conversion from a pulse-width signal to a digital signal and vice versa is made by means of the circuits of FIGS. 7a and 7b in the modules $M_1$ to $M_8$ which are connected to the NC bus through the common module NCM. The modules $M_1$ to $M_8$ serve as interface devices between the intermediate and digital signal portions of the system, and are arranged as either input modules, shown in FIG. 10, or as input and output modules, shown in FIG. 11.

Figure 10:
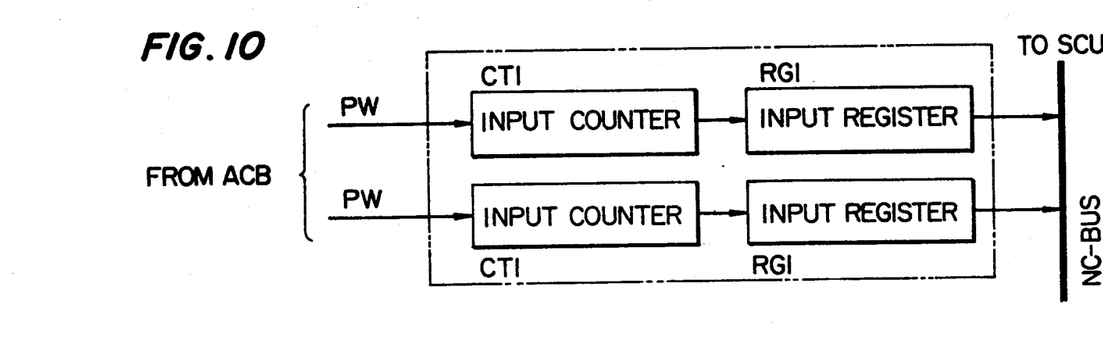
FIGS. 10 and 11 are schematic diagrams of modules used in the signal converters of FIG. 9.

The input module of FIG. 10 comprises two input counters CTI (similar to counters 11 in FIG. 7a) for counting the width of the input intermediate signal pulse, and two input registers RGI for holding the counted values. The data in the input registers is available to be supplied as an output digital signal corresponding to the value of the input analog signal, and can be read at any time by the control unit SCU through the NC bus.

Figure 11:
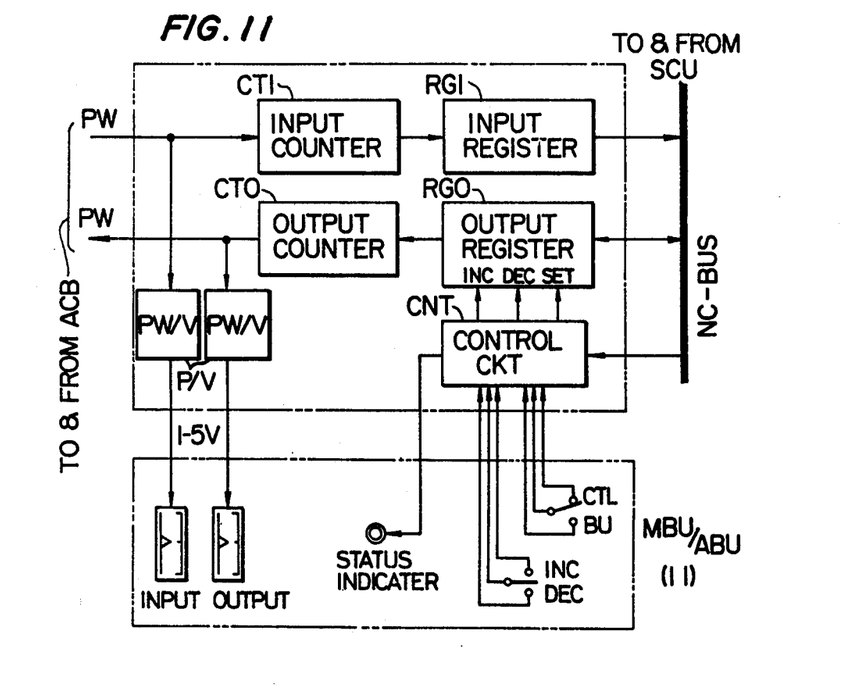

The input and output module shown in FIG. 11 comprises both an input system and an output system. The input system comprises an input counter CTI for counting the width of the input signal pulse, and an input register RGI for holding the counted value. The output system comprises an output register RGO for holding a digital signal from the control unit SCU, and an output counter CTO (similar to counter 12 of FIG. 7b) for converting the digital signal into a pulse-width signal. This input and output module is operated when the input signal and the output signal are a pair of input and output signals at a controlled element in a process. Through the output system of this module, the digital signal which is supplied from the control unit SCU via the NC bus is converted into an intermediate pulse-width signal. Thus the control unit SCU controls the converter AGN and its group of input and output modules, thereby controlling input and output of pulse-width signals.

The data stored in the output register RGO may be modified by the analog backup device 11 acting through the control circuit CNT. Modification is accomplished either automatically, or manually according to the indicated values of the input signal and the output signal provided to indicators in the backup unit 11 through the pulse-width to voltage converters P/V in the module. Automatic features of analog device 11 may be realized with elements commonly known in the field of automatic control. The analog backup device 11 itself has a manual backup unit PMU which may be of a portable type and is used in the event of need for its services. The manual backup unit PMU is connected directly to the desired signal converter unit in the signal converter device 4 and is operated as a standby to generate an output analog signal.

The process control system of the invention thus is arranged to accept a variety of analog input sensing signals from the field and to control a process according to digital data processed in the control unit SCU. The control unit SCU may be connected to a computer of higher hierarchy for the purpose of more sophisticated process control.

In summary, the process control system of the present invention has many advantages, among which are:

(1) the process control system is readily adaptable to both analog and digital control systems because a signal carrying data on its time axis is used as the intermediate signal;

(2) owing to the use of such an intermediate signal, the process control system is little affected by noise and thus can operate with high reliability;

(3) owing to the use of such an intermediate signal, signal isolation is simplified, signal branching at an isolation point is facilitated, and an intrinsically safe structure can readily be organized;

(4) the process control system uses no multiplexers and demultiplexers, permitting the overall circuit construction to be markedly simplified;

(5) the simplified overall circuit construction, together with the fact that the analog and digital systems are distinctly isolated from each other by an isolator, enhances efficiency in design, manufacturing, and services;

(6) analog means for monitoring and backup purposes can readily be connected into or disconnected from the process control system;

(7) because the intermediate signal is not one having data on its amplitude as in the prior art system, the signal amplitude can be made much smaller in the system of the invention than in the prior art, with the result that transmission lines of smaller diameter suffice for intermediate signals, contributing to significant cost reduction;

(8) because signal transmission paths are edited by the use of a digital logical circuit, the size of each editor can be reduced and entangled wiring on the editor terminals, which has often been encountered in prior systems, is avoided.

(9) signal path edition by a digital circuit facilitates fan-in fan-out arrangements, thus facilitating system multiplexing and thereby enhancing system reliability through redundancy;

(10) the process control system is suited for installation near the process-data originating point and terminating point and hence the need for a primary terminal where process primary signal lines are converged is obviated.

Although specific embodiments of the invention have been disclosed herein in detail, it is to be understood that this is for the purpose of illustrating the invention, and should not be construed as necessarily limiting the scope of the invention, since it is apparent that many changes can be made to the disclosed structure by those skilled in the art to suit particular applications.

We claim:

1. In a process control system arranged to accept varied forms of analog sensing signals from a plurality of field sensing devices, to process data represented thereby both digitally and in analog fashion, and to supply varied forms of analog control signals to a plurality of analog field control devices, the improvement which comprises:

an input signal converter means for each field sensing device for converting data from (a) the varied analog forms generated by the field sensing devices to (b) first input intermediate signals in a standard form arranged to carry data as a function of time duration;

isolator means for each of said input signal converter means and having an input and an output section; means for directing the first input intermediate signal developed by each input signal converter to a respective input section, the associated output section being arranged to provide a second input intermediate signal corresponding directly to the first input intermediate signal fed to said input section but conductively isolated therefrom;

an input digital interface and storage means for each field sensing device for converting data from (a) the corresponding second input intermediate signal to (b) input digital signals in a form for use by digital data processing means, and for storing the input digital signals for use on demand by the data processing means;

an output digital interface and storage means for each field control device for storing output digital signals supplied by the data processing means and for converting the output digital signals into first output intermediate signals in a standard form arranged to carry data as a function of time duration;

analog data processing means; means for converting data derived from said second input intermediate signals into input analog signals for use by said analog processing means; means for converting output analog signals from said analog data processing means into an additional set of said first output intermediate signals;

isolator means for each of said output signal converter means and having an input section and an output section; means for directing the first output intermediate signals to respective input sections of said isolator means, the output section of each isolator means being arranged to provide a second output intermediate signal corresponding directly to the intermediate signal fed to the input section thereof but conductively isolated therefrom;

conductively-isolated power supply means supplying power to (1) said input sections of said isolator means for said input signal converter means and (2) said output sections of said isolator means for said output signal converter means;

an output signal converting means for each field control device for converting said second output intermediate signals into the varied forms of output analog control signals required by the field control devices; and signal path editing means comprising a plurality of separate input terminal means and a plurality of separate output terminal means; means interconnecting selected input terminal means to selected output terminal means to provide a preselected set of signal paths between certain of said input terminal means and certain of said output terminal means; said interconnecting means providing for ready alteration of said preselected set of signal paths to any of a number of different sets of signal paths to accommodate variation in required signal transmissions; means connecting predetermined output sections of said isolator means to corresponding ones of output terminal means; and means connecting each of said output terminal means to said input digital interface and storage means.

* * * * *